(12) United States Patent
Iizuka

(10) Patent No.: US 11,035,041 B2
(45) Date of Patent: Jun. 15, 2021

(54) FILM-FORMING APPARATUS AND FILM-FORMING METHOD

(71) Applicant: TOKYO ELECTRON LIMITED, Tokyo (JP)

(72) Inventor: Yoji Iizuka, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 112 days.

(21) Appl. No.: 16/378,799

(22) Filed: Apr. 9, 2019

(65) Prior Publication Data
US 2019/0316257 A1    Oct. 17, 2019

(30) Foreign Application Priority Data

Apr. 11, 2018   (JP) .............................. JP2018-076196

(51) Int. Cl.
*C23C 16/52*   (2006.01)
*B05D 1/00*    (2006.01)

(52) U.S. Cl.
CPC ................ *C23C 16/52* (2013.01); *B05D 1/60* (2013.01)

(58) Field of Classification Search
CPC .............................................. C23C 16/45523
See application file for complete search history.

(56) References Cited

U.S. PATENT DOCUMENTS

| | | | |
|---|---|---|---|
| 8,685,500 B2 | 4/2014 | Gersdorff | |
| 2003/0072947 A1* | 4/2003 | Lee | C08L 65/00 428/421 |
| 2009/0238968 A1* | 9/2009 | Hatanaka | C23C 16/4402 427/237 |
| 2015/0377571 A1 | 12/2015 | Hiroki | |
| 2017/0100743 A1* | 4/2017 | Pore | B05D 1/36 |

* cited by examiner

*Primary Examiner* — Joseph A Miller, Jr.
(74) *Attorney, Agent, or Firm* — Nath, Goldberg & Meyer; Jerald L. Meyer

(57) ABSTRACT

There is provided a film-forming apparatus and a film-forming method. The film-forming apparatus, in a first period, sets the second heater to a temperature T1 at which no film is formed on a substrate disposed on the mounting stand without supplying a precursor gas into the process container, in a second period, sets the second heater to a temperature T2 at which no film is formed on the substrate and supplies a precursor gas into the process container from the precursor gas supply pipe, in a third period, sets the second heater to a film-forming temperature T3, and in the first to third periods, sets the first heater to a temperature T4 at which no film is formed on a periphery of a gas supply port of the precursor gas supply pipe.

11 Claims, 4 Drawing Sheets

FILM-FORMING APPARATUS AND FILM-FORMING METHOD

CROSS-REFERENCE TO RELATED APPLICATION

This application is based upon and claims the benefit of priority from Japanese Patent Application No. 2018-076196, filed on Apr. 11, 2018, the entire contents of which are incorporated herein by reference.

TECHNICAL FIELD

The present disclosure relates to a film-forming apparatus and a film-forming method.

BACKGROUND

A film-forming apparatus for forming a polymer by polymerizing multiple kinds of gaseous monomers in a process container is known. In this film-forming apparatus, a gas supply component of a shower head (a shower structure) is disposed in the process container and a precursor gas flows toward a substrate. In addition, in this film-forming apparatus, the temperature of the gas discharge surface is between 150 degrees C. and 250 degrees C., and is set to be higher than the temperature of a mounting stand for the substrate. Further, another related art discloses a mounting stand capable of uniform heating.

SUMMARY

However, the conventional film-forming apparatus has a problem in that it is difficult to manufacture a high-quality film. The present disclosure has been made in view of such problem, and to provide a film-forming apparatus and a film-forming method capable of producing a high-quality film.

As a result of intensive review by the inventors of the present disclosure, it has been found that, in the conventional manufacturing apparatus, for example, the uniformity of a film is fluctuated due to a large flow of a precursor gas.

According to one embodiment of the present disclosure, there is provided a film-forming apparatus that includes a process container; a mounting stand disposed in the process container; a precursor gas supply pipe configured to communicate with the process container; an exhaust pipe configured to communicate with the process container; a first heater configured to heat the process container; a second heater configured to heat the mounting stand; and a controller connected to the first heater and the second heater, wherein the controller is configured to: in a first period, set the second heater to a temperature $T1$ at which no film is formed on a substrate disposed on the mounting stand without supplying a precursor gas into the process container in a state in which the substrate is disposed on the mounting stand; in a second period after the first period, set the second heater to a temperature $T2$ at which no film is formed on the substrate and supply the precursor gas into the process container from the precursor gas supply pipe in the state in which the substrate is disposed on the mounting stand; in a third period after the second period, set the second heater to a film-forming temperature $T3$ which is smaller than the temperature $T2$ in the state in which the substrate is disposed on the mounting stand; and in the first period to the third period, set the first heater to a temperature $T4$, which is greater than the temperature $T3$, at which no film is formed on a periphery of a gas supply port of the precursor gas supply pipe by bonding the precursor gas that flows into the process container from the precursor gas supply pipe.

According to one embodiment of the present disclosure, there is provided a film-forming method that includes setting, in a first period, the substrate disposed on a mounting stand to a temperature $T1$ at which no film is formed on the substrate without supplying a precursor gas into a process container in a state in which the substrate is disposed on the mounting stand within the process container; setting, in a second period after the first period, the substrate to a temperature $T2$ at which no film is formed on the substrate and supplying the precursor gas into the process container from a precursor gas supply pipe in the state in which the substrate is disposed on the mounting stand; setting, in a third period after the second period, the substrate to a film-forming temperature $T3$, which is smaller than the temperature $T2$, for the film to be formed on the substrate in the state in which the substrate is disposed on the mounting stand; and setting, in the first period to the third period, the process container to a temperature $T4$, which is greater than the temperature $T3$, at which no film is formed on a periphery of a gas supply port of the precursor gas supply pipe installed in the process container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
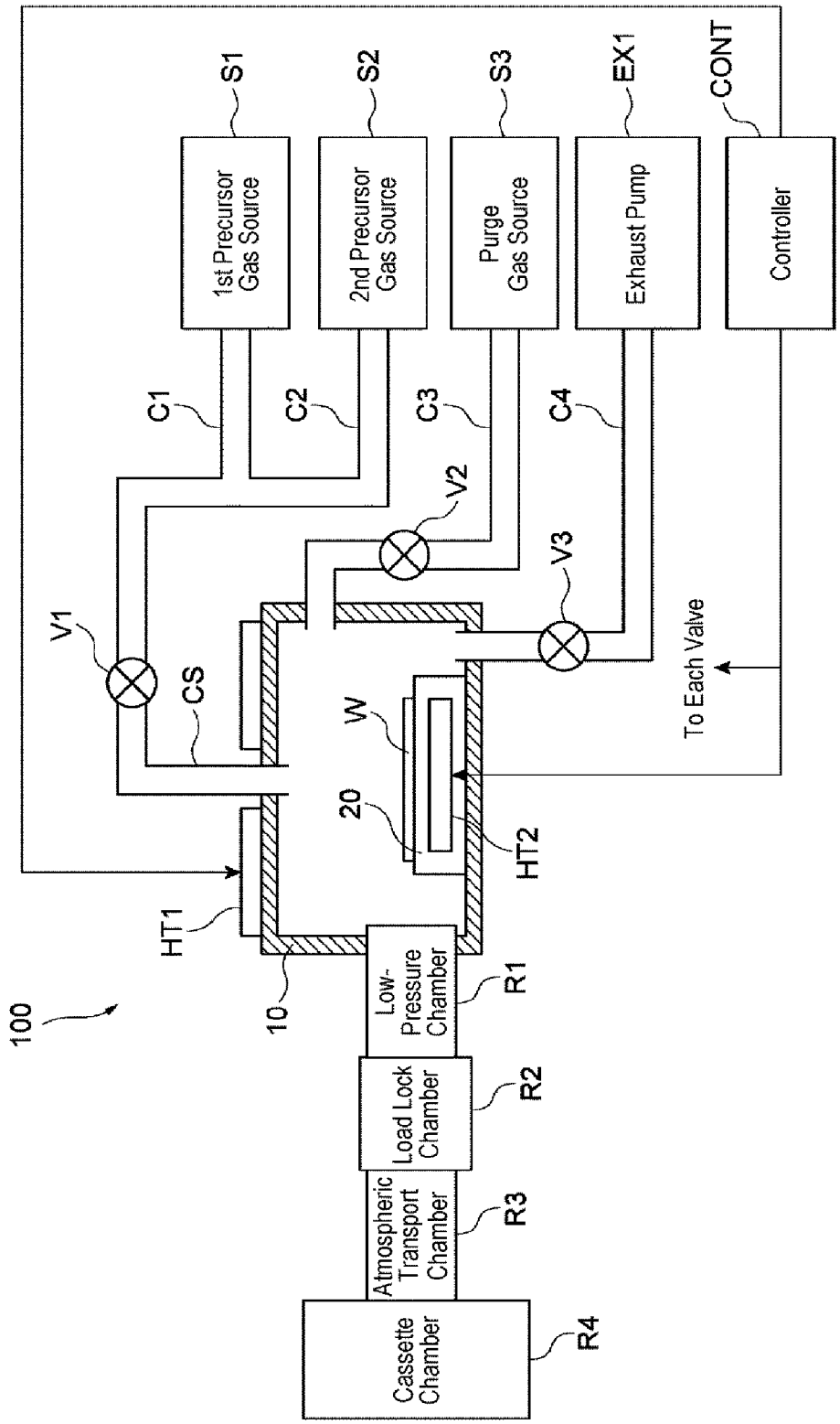
FIG. 1 illustrates a structure of a film-forming apparatus.

Reference will now be made in detail to various embodiments, examples of embodiments are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a film-forming apparatus and a film-forming method according to an embodiment of the present disclosure will be described. The same reference numerals are used for the same elements, and a redundant description is omitted.

FIG. 1 illustrates the structure of a film-forming apparatus.

The film-forming apparatus 100 includes a process container 10, a mounting stand 20 disposed in the bottom portion of the process container 10, a precursor gas supply pipe CS configured to communicate with the process container 10, an exhaust pipe C4 configured to communicate with the process container 10, a first heater HT1 configured to heat the process container 10, a second heater HT2 configured to heat the mounting stand 20, and a controller CONT connected to the first heater HT1 and the second heater HT2.

The precursor gas supply pipe CS, a purge gas supply pipe C3, and the exhaust pipe C4 communicate with and are connected to the process container 10.

The precursor gas supply pipe CS is a pipe configured to supply precursor gases into the process container 10, and is connected to a first precursor gas source S1 and a second precursor gas source S2 through a first gas supply valve V1. A first precursor gas generated in the first precursor gas source S1 reaches the first gas supply valve V1 through a first supply pipe C1, and a second precursor gas generated in the second precursor gas source S2 reaches the first gas supply valve V1 through a second supply pipe C2. When the first gas supply valve V1 is open, the first precursor gas and second precursor gas travel inside the precursor gas supply pipe CS through the first gas supply valve V1 so as to be supplied into the process container 10 serving as a chamber. In the precursor gas sources, the temperature of a precursor storage container is controlled by the controller, and a precursor gas is output to the outside from the precursor storage container depending on the vapor pressure of the precursor. As a gas generation method, there is also, for example, a method of supplying a precursor into a vaporizer (atomizer) to convert the liquid material into a gas.

The purge gas supply pipe C3 is a pipe configured to supply a purge gas into the process container 10, and is connected to the purge precursor gas source S3 through the second gas supply valve V2. The purge gas output from the purge gas source S3 reaches the second gas supply valve V2 through the purge gas supply pipe C3. When the second gas supply valve V2 is open, the purge gas is supplied into the process container 10 through the second gas supply valve V2.

The exhaust pipe C4 is a pipe configured to exhaust a gas in the process container 10, and is connected to an exhaust pump EX1 through a gas exhaust valve V3. When the gas exhaust valve V3 is open, the gas inside the process container 10 reaches the exhaust pump EX1 through the gas exhaust valve V3. For the exhaust pump EX1, a pump such as a dry pump, a rotary pump, a turbo molecular pump, or an ion pump may be used.

The film-forming apparatus 100 includes the first heater HT1 and the second heater HT2 as heating parts.

The first heater HT1 is configured to heat the process container 10. Specifically, the first heater HT1 heats the outer wall (surrounding wall) of the process container 10. In particular, the first heater HT1 heats the tip portion of the precursor gas supply pipe CS, that is, a gas supply port in the process container 10. This is to prevent a film from being formed around the gas supply port of the precursor gas supply pipe CS. In this example, it is assumed that the temperature of the first heater HT1 is equal to the temperature of the tip portion of the precursor gas supply pipe CS and equal to the temperature of the outer wall of the process container 10. In an embodiment of the film-forming apparatus 100, various supply pipes CS, C1, and C2 can be heated as well, to prevent a film from adhering in the supply pipes. In particular, the first supply pipe C1 and the second supply pipe C2 are heated such that a monomer does not liquefy again. The heating temperature is set to a temperature slightly lower than the temperature of the outer wall of the process container and higher than the temperature at which a precursor is vaporized. Heaters for the heating are installed in the various supply pipes CS, C1, and C2, respectively.

The second heater HT2 is configured to heat the mounting stand 20 (and a substrate). In an embodiment, the second heater HT2 is buried in the mounting stand 20. In the case in which the second heater HT2 adopts radiation, the second heater HT2 may be disposed above the mounting stand 20. As an optical-radiation-type heater using optical radiation, an optical annealing apparatus such as a lamp annealing apparatus using, for example, a halogen lamp is known.

The second heater HT2 may be a resistance-heating-type heater arranged in the mounting stand. The resistance-heating-type heater may heat the second heater HT2 by energizing various conductive resistors (e.g., W, Cu, graphite, $Al_2O_3$, or BN (boron nitride)) using the controller CONT. The surfaces of the resistors may be coated with a suitable insulating film (e.g., SiC, $Al_2O_3$, or AlN). The type of the second heater HT2 is not limited to the resistance-heating-type, but may be a heater of any type in which a heat exchange medium flows into a pipe. As for the heat exchange medium, fluorine-based liquids and other gases may be used, in addition to water. As for the structure of the mounting stand having the type using a heater that performs heat exchange, reference is made to the structure described in U.S. Patent Application Publication No. 2015/377571.

When the second heater HT2 is heated, the mounting stand 20 is also heated, and in the case where a substrate W is disposed on the mounting stand 20, the substrate W is also heated. In an embodiment, it is assumed that the temperature of the second heater HT2 is equal to the temperature of the mounting stand 20, and equal to the temperature of the substrate W. The mounting stand 20 may include an electrostatic chuck for fixing the substrate.

As for the structure of the second heater HT2, similar to the structure of the first heater HT1, a resistance heating type, a heat exchange type, or a light emission type may be used.

The substrates W in the process container 10 are taken in and out in order. That is, in the case of discharging the substrate W from the inside of the process container 10, a valve connecting the process container 10 and a low-pressure transport chamber R1 is opened, the substrate W within the process container 10 is moved to the low-pressure transport chamber R1 by a transport robot disposed in the low-pressure transport chamber R1, and the valve is closed. Thereafter, a valve between a load lock chamber R2 and the low-pressure transport chamber R1 is opened, the substrate W is moved to the load lock chamber R2, and the valve connected to the load lock chamber R2 is closed. Next, after filling the load lock chamber R2 with a purge gas, a valve between the load lock chamber R2 and an atmospheric transport chamber R3 is opened, and the substrate W within the load lock chamber R2 is transported to a cassette chamber R4 by a transport robot disposed within the atmospheric transport chamber R3. In the cassette chamber R4, a cassette having multiple shelves, each configured to hold one of multiple substrates, is arranged. The substrate discharging step is performed as described above.

The step of loading substrates into the process container 10 is reversed from the above discharging step. A substrate held in the cassette chamber R4 is taken out by the robot in the atmospheric transport chamber R3, and the substrate is transported from the atmospheric transport chamber R3 to the load lock chamber R2 in the state in which the load lock chamber R2 is set to the normal pressure. Next, the valve on the atmospheric transport chamber R3 side in the load lock chamber R2 is closed, the pressure inside the load lock chamber R2 is reduced, and the valve on the low-pressure transport chamber R1 side is opened. Thereafter, the valve on the load lock chamber R2 side in the low-pressure transport chamber R1 and the valve on the process container 10 side are opened, and the substrate located in the load lock chamber R2 is transported by the transport robot in the low-pressure transport chamber R1 onto the mounting stand 20 within the process container 10.

The controller CONT is configured to control the operation of each element in the film-forming apparatus. That is, the controller CONT controls the first heater HT1, the second heater HT2, the first gas supply valve V1, the second gas supply valve V2, the gas exhaust valve V3, the gas vapor pressure in the first precursor gas source S1 (heating and/or temperature control), the gas vapor pressure in the second precursor gas source S2 (heating and/or temperature control), and the loading and/or unloading operation of the substrate. Further, the controller CONT also controls the heating of various supply pipes CS, C1, and C2 to perform temperature control.

A film-forming processing under the control of the controller CONT will be described below.

Figure 2:
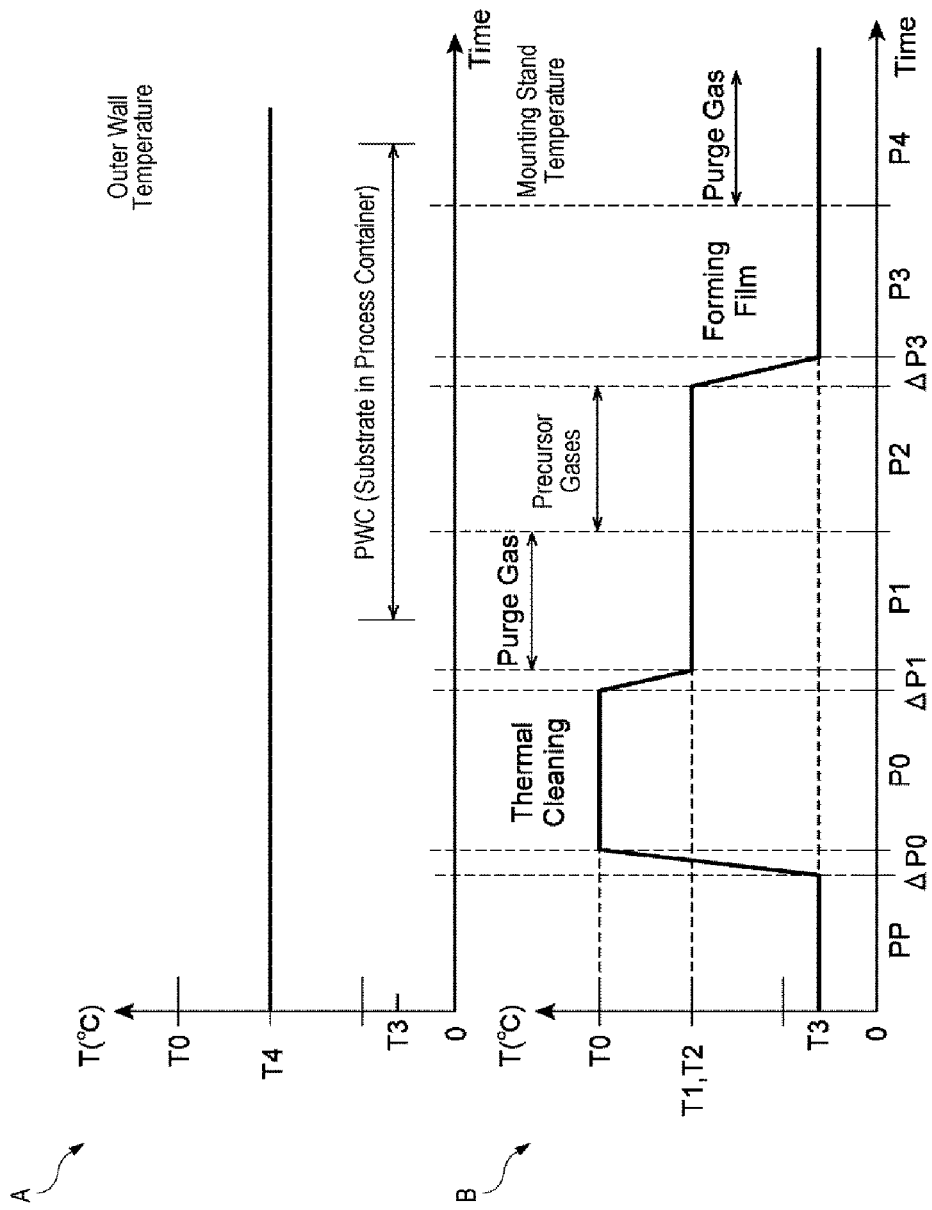
FIG. 2 illustrates timing charts of a processing state.

FIG. 2 illustrates timing charts of a processing state.

Referring to FIG. 2, Graph A illustrates the temperature of the first heater HT1 (the temperature of the outer wall of the process container), and Graph B illustrates the temperature of the second heater HT2 (the temperature of the mounting stand and substrate).

An initial period PP, a cleaning period P0, a first period P1, a second period P2, a third period P3, and a fourth period P4 are illustrated.

The temperature of the first heater HT1 is set to a constant temperature T4 from the initial period PP to the fourth period P4. The temperature T4 is a temperature that inhibits the bonding of a precursor gas, and no film is formed on the outer wall of the process container at the temperature T4.

The temperature of the second heater HT2 is set to a temperature T3 in the initial period PP, a temperature T0 (thermal dissociation temperature) in the cleaning period P0, a temperature T1 in the first period P1, a temperature T2 in the second period P2, the temperature T3 in the third period P3, and the temperature T3 in the fourth period P4 as well.

Here, the temperature T3 is a film-forming temperature at which a film is formed when bonding of a precursor gas occurs, the temperature T0 is a temperature at which the film thermally dissociates, and the temperature T1 and the temperature T2 are temperatures at which a film does not dissociate but no film is formed.

In addition, each period is initiated when a target temperature is reached and is terminated when the temperature deviates from the target temperature. Between the initial period PP and the cleaning period P0, there is a temperature-rising transition period ΔP0, and between the cleaning period P0 and the first period P1 there is a temperature-falling transition period ΔP1. In the first period P1 and the second period P2, since the temperature T1 and the temperature T2 are the same in this example, there is no transition period, but if these temperatures are different, there will be a transition period. Between the second period P2 and the third period P3, a temperature-falling transition period ΔP3 exists. In the third period P3 and the fourth period P4, since the temperature T3 in these periods is constant in this example, there is no transition period, but if these temperatures in these time periods are different, there will be a transition period.

The substrate W (wafer) is loaded into the process container 10 at a certain time within the first period P1, placed on the mounting stand 20, and unloaded from the inside of the process container 10 at a certain time in the fourth period P4 after the film-forming processing. That is, the period during which the substrate W is present in the process container, that is, the period PWC illustrated in FIG. 2 is from a predetermined time within the first period P1 to a predetermined time within the fourth period P4. The loading and unloading steps of the substrate W are performed as described above.

As a combination of (1) a target film and (2) precursor gases, the following may be considered.

(1) Target Film: Polyurea film
(2) Precursor Gases
    First Precursor Gas: Isocyanate
    Second Precursor Gas: Amine For the isocyanate, for example, xylylene diisocyanate (XDI) and hydrogenated xylylene diisocyanate ($H_6$XDI) are known, and the structural isomers thereof are also known.

For the amine, for example, xylylene diamine (XDA) and hydrogenated xylylene diamine ($H_6$XDA) are known, and the structural isomers thereof are also known. When $H_6$XDA and $H_6$XDI are used, a film may be formed at 70 degrees C.

When the monomers of these precursor gases are supplied into the process container from the precursor gas sources and the substrate is set to the film-forming temperature T3, then the target film is formed on the substrate. The temperature at which a polymerization reaction of a polymer occurs from a monomer of a precursor gas is the film-forming temperature T3 (which is equal to or higher than the room temperature, 70 degrees C. in this example). The temperature at which a decomposition reaction from the polymer to the monomer occurs is the thermal dissociation temperature (e.g., 400 degrees C. or higher). The temperature at which no film is formed and decomposition is not performed are temperatures T1 and T2 (e.g., 120 degrees C. or higher, and lower than 400 degrees C.), that are between temperatures T3 and T0. Further, temperature T1=temperature T2=temperature T4 (the temperature of the first heater HT1) may be set. In addition, in this exemplary embodiment, it is assumed that film-formation is impossible at a temperature that is higher than the film-forming temperature T3 by 50 degrees C. or more, and thermal dissociation does not occur at a temperature that is lower than the thermal dissociation temperature T0.

For the first monomer and the second monomer, the vapor pressure is set to be relatively high, for example, to 1 Torr (133.3 Pa) or higher at 200 degrees C. such that that the first monomer and the second monomer can be easily vaporized and supplied into the process container. That is, the pressure within the process container at the initiation of film-formation may be set to a target value of 133 Pa or higher. If the pressure within the process container is too high, a precursor gas is not supplied into the process container, therefore, the target value of the pressure within the process container during film-formation may be set to, for example, 1 atm (760 Torr ($1 \times 10^5$ Pa) or lower at 200 degrees C.

The combination of a target film and precursor gases is not limited to the combination described above, and the method can be used as long as two or more kinds of gasified precursors are polymerized when the temperature is lowered.

For example, it is possible to form a polyurea film at 140 degrees C. when 4,4'-diphenylmethane diisocyanate (MDI) and 1,12-aminododecane (DAD) are used as precursor gases, as a combination of a first monomer and a second monomer for forming polyurea. Using DAD and $H_6$XDI, a polyurea film can be formed at 100 degrees C. As described above, when $H_6$XDA and $H_6$XDI are used, it is possible to form a film at 70 degrees C., and when hexamethylene diamine and H$_6$XDI are used, it is possible to form a polyurea film at 40 degrees C.

For isocyanate, which is one of the precursors necessary for synthesis of a film as described above, tolylene diisocyanate (TDI), diphenylmethane diisocyanate (MDI), hexamethylene diisocyanate (HDI), isophorone diisocyanate (IPDI), xylylene diisocyanate (XDI), hydrogenated xylylene diisocyanate (H$_6$XDI), naphthalene diisocyanate (NDI), norbornene diisocyanate (NBDI), and 1,5-pentamethylene diisocyanate (PDI) are known, and structural isomers thereof are also known, in addition to the above-mentioned precursors.

There are also many kinds of amines, which are the other precursors necessary for synthesis of a film, and there are many organic films capable of low-temperature polymerization. For example, as two kinds of monomers to be polymerized at a low temperature to form polyimide as a target film, diimine as a first monomer and acid anhydride as a second monomer may be used. Specifically, it is possible to form a polyimide film at 200 degrees C. using 4,4'-oxydianiline (44 ODA) and pyromellitic anhydride (PMDA: C$_{10}$H$_2$O$_6$ (1,2,4,5-benzene tetracarboxylic dianhydride)) as a combination of a diamine and an acid anhydride. In addition, it is possible to form a polyimide film at 150 degrees C. using hexamethylenediamine (HMDA) and PMDA.

In the case of forming a polyimide film, as a precursor gas for film-formation, for example, 1,2,3,4-cyclobutanetetracarboxylic dianhydride (CBDA) or cyclopentane tetracarboxylic acid dianhydride (CPDA) may be included instead of PMDA, and, for example, ODA (C$_{12}$H$_{12}$N$_2$O: 4,4'-diaminodiphenyl ether) or 4,4'-diaminodicyclohexylmethane (H$_{12}$MDA) may be included. In addition to polyurea and polyimide, many precursors for synthesizing polymer films of, for example, polyamide, polyamideimide, polyurethane, and polyazomethine, are also known.

When the first period P1, the second period P2, and the third period P3 are set in this order, and the thermal dissociation temperature of the target film is set to the temperature T0, the controller CONT performs the following heating control. Together with FIG. 2, the structure of FIG. 1 can be referenced.

In the first period P1, in the state in which the substrate W is placed on the mounting stand 20, the controller CONT does not cause a precursor gas to be supplied into the process container 10, and sets the second heater HT2 to the temperature T1 (T1<T0) at which no film is formed on the substrate W.

In the second period P2, in the state in which the substrate W is placed on the mounting stand 20, the controller CONT sets the second heater HT2 to the temperature T2 (T2<T0) at which no film is formed on the substrate W and supplies a precursor gas into the process container 10 from the precursor gas supply pipe CS. In the third period P3, in the state in which the substrate W is placed on the mounting stand 20, the controller CNT sets the second heater HT2 to the film-forming temperature T3 (T3<T2). In the first period P1 to the third period P3, the controller CONT sets the first heater HT1 to the temperature T4 (T3<T4<T0) at which no film is formed on a periphery of the gas supply port of the precursor gas supply pipe CS, by bonding a precursor gas flowing into the process container 10 from the precursor gas supply pipe CS.

According to this film-forming apparatus, in the state in which no film is formed on the periphery of the gas supply port of the process container 10 (temperature T4) and in the state in which no film is deposited to the substrate W on the mounting stand 20 (temperature T2), a precursor gas is filled in the process container 10 (the second period P2).

After the precursor gas is filled in the second period P2, by controlling the valves (the first gas supply valve V1, the second gas supply valve V2, and the gas exhaust valve V3) connected to the process container 10, it is possible to create the state in which generation of a gas flow in the process container is suppressed (the third period P3).

In the third period P3, there can be the following types of control to create "the state of suppressing generation of a gas flow in the process container." "OPEN" means an opening of 80% or more relative to the full-opening of a valve (a flow rate is 80% or more of the flow rate when a valve is fully opened), "CLOSE" means that a valve is fully closed (valve opening=0% (flow rate=0%)), and "LEAK" means that a flow rate is set to 30% or less relative to the flow rate at the full-opening of a valve by lowering a precursor generation capability in the OPEN state. In addition, it is possible to adjust the precursor gas generation capability by controlling the temperature (vapor pressure) in a precursor gas source. In order to control the temperature (vapor pressure), a heater may be installed in the precursor gas source, and the temperature of the heater may be controlled by using the controller.

(First Type Control)
First gas supply valve V1: CLOSE
Gas exhaust valve V3: OPEN
(Second Type Control)
First gas supply valve V1: CLOSE
Gas exhaust valve V3: LEAK
(Third Type Control)
First gas supply valve V1: CLOSE
Gas exhaust valve V3: CLOSE
(Fourth Type Control)
First gas supply valve V1: LEAK
Gas exhaust valve V3: OPEN
(Fifth Type Control)
First gas supply valve V1: LEAK
Gas exhaust valve V3: LEAK
(Sixth Type Control)
First gas supply valve V1: LEAK
Gas exhaust valve V3: CLOSE In the six types of control described above, the second gas supply valve V2 for supplying a purge gas is in the CLOSE state, but may also be in the LEAK state.

In the six types of control described above, the control of the type can be the control of third type or fifth type, and may sufficiently suppress the generation of the gas flow in the process container.

Since the second period P2 is a period of encapsulating the precursor gas, the gas exhaust valve V3 is placed in the CLOSE or LEAK state in at least a part of the second period P2. The gas exhaust valve V3 may be set to the CLOSE state at a point of time slightly before the beginning of the precursor gas encapsulation (within the first period P1), and the gas exhaust valve V3 may be set to the OPEN state at a period within the second period P2. This is for maintaining the pressure within the process container at the target value.

The default opening and closing setting of the valves in the initial period PP, the washing period P0, the first period P1, the second period P2, the third period P3, and the fourth period P4 are as follows, and as necessary, the valve control setting described above may be adopted.

(Initial Period): Substrate Unloading Period.
First gas supply valve V1: CLOSE
Second gas supply valve V2: CLOSE
Gas exhaust valve V3: OPEN (Cleaning Period P0): Thermal Cleaning Period
First gas supply valve V1: CLOSE
Second gas supply valve V2: OPEN
Gas exhaust valve V3: OPEN
(First Period P1): Purge Gas Filling/Substrate Loading Period
First gas supply valve V1: CLOSE
Second gas supply valve V2: OPEN
Gas exhaust valve V3: OPEN
(Second Period P2): Precursor Gas Filling Period
First gas supply valve V1: OPEN
Second gas supply valve V2: CLOSE
Gas exhaust valve V3: CLASE (during the period) or CLOSE (first half of the period)/LEAK (second half of the period)
(Third Period P3): Film-Forming Period
First gas supply valve V1: CLOSE
Second gas supply valve V2: CLOSE
Gas exhaust valve V3: CLOSE (during the period) or CLOSE (first half of the period)/LEAK (second half of the period)
(Fourth Period P4): Growth Stop Period
First gas supply valve V1: CLOSE
Second gas supply valve V2: OPEN
Gas exhaust valve V3: OPEN While performing the above-described gas flow control, at the time of terminating the second period P2, if a gas flow suppression state is created and the temperature of the mounting stand is lowered to lower the substrate temperature to the film-forming temperature T3 in the third period P3, the precursor gas is bonded to form a film on the substrate. To define this state relatively, in the third period P3, the flow speed (the maximum value) of the gas flow flowing along the substrate surface is slower than the flow speed of the gas flow in the second period P2. In the third period P3, since the inside of the process container 10 is statically stable, it is possible to form a high-quality film. After the fourth period P4, the process returns to the initial period PP promptly, and the substrate W is unloaded from the inside of the process container 10. In the initial period PP, the second gas supply valve V2 for supplying a purge gas is set to CLOSE, but it may also be set to OPEN.

As described above, the above-described film-forming apparatus includes the first gas supply valve V1 installed in the precursor gas supply pipe CS, the gas exhaust valve V3 installed in the exhaust pipe C4. In the second period P2, the controller CONT controls these valves to open the first gas supply valve V1 (OPEN) and close the gas exhaust valve V3 (CLOSE) for at least one predetermined period. In the third period P3, the controller CONT lowers the precursor gas generation capability in the first precursor gas source S1 and the second precursor gas source S2 in the state in which the first gas supply valve V1 is set to the OPEN state. In addition, the controller CONT controls a control target to lower a flow rate that passes through the first gas supply valve V1 in the third period P3 than the flow rate that passes through the first gas supply valve V1 in the second period P2. When a valve capable of adjusting the flow rate is used, the valve may be controlled as the control target. However, in order to lower the flow rate in the state in which the valve is set to the OPEN state, a heater may be installed to the precursor gas source and controlled by the controller such that the heater temperature is lowered thereby lowering the precursor generation capability. That is, the heater is controlled as the control target.

In order to fill the process container 10 with the precursor gas (second period P2) and to create the above-mentioned static state, as described above, the valve is closed or the opening degree thereof is decreased (third period P3). This statistically stabilizes the inside of the process container 10, and it is possible to form a high quality and uniform film.

In addition, in the film-forming apparatus described above, the gas exhaust valve V3 may be closed (CLOSE) in the third period P3. That is, during the film-formation, by closing the gas exhaust valve V3, it is possible to reduce the flow speed of the gas flow in the process container 10 and to create the gas flow suppression state. As described above, in the second half of the third period P3, the gas exhaust valve V3 may be set to LEAK state.

In addition, in the film-forming apparatus described above, the first gas supply valve V1 may be closed (CLOSE) in the third period P3. During the film-formation, by closing the first gas supply valve V1, it is possible to reduce the flow speed of the gas flow in the process container 10 and to create the gas flow suppression state.

In the film-forming apparatus illustrated in FIG. 1, in the gas flow path between the mounting stand 20 and the precursor gas supply pipe CS, a shower structure (shower head) for controlling a flow of precursor gas is not installed. Conventionally, a shower structure (shower head) for uniformly radiating a gas flow to the entire surface of the substrate is installed above the substrate. However, since film-formation is performed in a static state in this film-forming apparatus, a shower structure is not required, and thus it is possible to reduce the number of parts.

In the film-forming apparatus described above, the controller CONT controls the purge gas control valve (the second gas supply valve V2) to supply a purge gas into the process container 10 in the first period P1. In the first period P1, the precursor gas is not supplied into the process container 10, but unnecessary elements present in the process container 10 are discharged to the outside by supplying the purge gas, such that the state within the process container 10 in the next process can be maintained clean.

In the film-forming apparatus described above, in a period prior to the first period P1 (the cleaning period P0), the controller CONT may set the second heater HT2 to the thermal dissociation temperature T0 of a film in the state in which the upper surface of the mounting stand 20 is exposed (the state in which the upper surface of the mounting stand 20 is exposed after the substrate is unloaded).

In the initial period PP (overlapping the fourth period P4), the substrate W after subjected to the previous processing is unloaded to the outside of the process container 10 through the low-pressure transport chamber R1, and after the cleaning period P0, the substrate W to be subjected to the current processing is loaded into the process container 10 within the first period P1. In detail, the gate valve between the process container 10 and the low-pressure transport chamber R1 is opened during the initial period PP, during which the processed substrate is unloaded and the gate valve is closed immediately before the cleaning period P0. In the first period P1 after the cleaning period P0, the gate valve is opened again, a new substrate W is transported from the low-pressure transport chamber R1 into the process container 10, and the gate valve is closed after the transport is completed.

That is, in the step of sequentially processing multiple substrates, the precursor gas sometimes adheres to the mounting stand 20 in a previous film-forming step, and this deposit may affect the film quality in the present film-forming step. Therefore, by performing a heating step using the second heater HT2 before loading the current substrate (in the state in which the upper surface of the mounting stand 20 is exposed after the previous substrate is carried out: the cleaning period P0), the adhered film is thermally dissociated. This improves the quality of the film produced in the current film-forming step, and improves reproducibility and film-formation stability. Although such cleaning (thermal cleaning) may be carried out each time a film is formed, there is no particular limitation on the cleaning cycle, and it is also possible to carry out the cleaning once every several hundreds of substrates.

Next, control for further improving film quality will be described.

Figure 3:
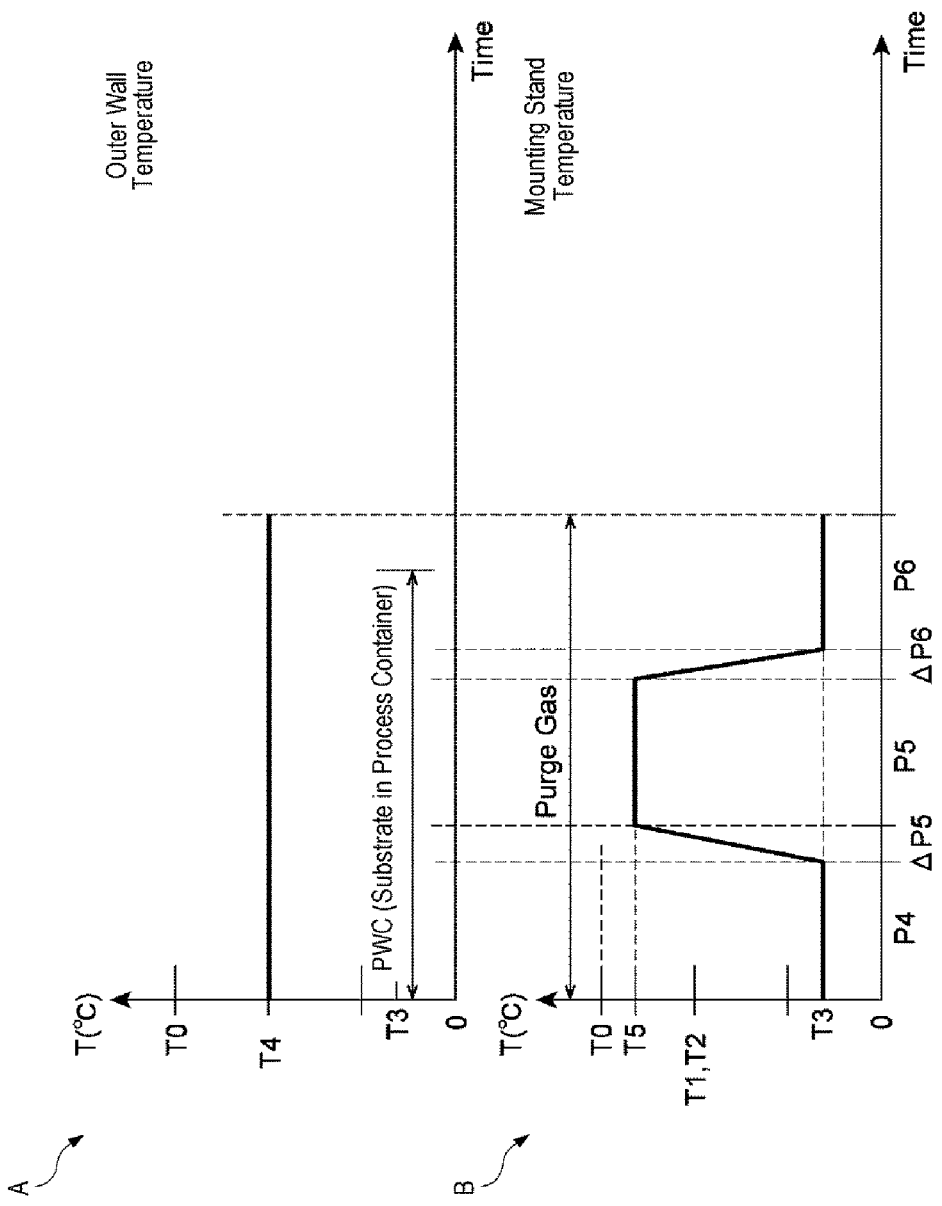
FIG. 3 illustrates timing charts of a processing state.

FIG. 3 illustrates timing charts of a processing state.

Referring to FIG. 3, steps after the fourth period P4 in the steps illustrated in FIG. 2 are illustrated, but the substrate on which the film-forming processing has been completed is not unloaded to the outside of the process container 10. In this state, the temperature of the second heater HT2 is increased from the temperature T3 to the temperature T5. A temperature transition period is indicated as ΔP5. The temperature T5 is an annealing temperature.

That is, in the film-forming apparatus described above, the controller CONT stops the supply of the precursor gas from the precursor gas supply pipe CS in the state in which the substrate W is placed on the mounting stand 20 after the third period P3, and sets the second heater HT2 to the annealing temperature T5 (T2<T5<T0). The state of each valve is as follows.

(Fourth Period P4): Growth Stop Period
First gas supply valve V1: CLOSE
Second gas supply valve V2: OPEN
Gas exhaust valve V3: OPEN
(Fifth Period P5): Annealing Period
First gas supply valve V1: CLOSE
Second gas supply valve V2: OPEN
Gas exhaust valve V3: OPEN That is, regions (voids) having a low density may be formed in a film immediately after the third period P3, which is the film-forming period. However, by heating the substrate W to the anneal temperature T5 (e.g., 260 degrees C., for five minutes), the voids can be reduced, and a high-quality film can be formed. As the annealing temperature T5, 200 degrees C. to 300 degrees C. may be adopted.

After the termination of annealing, the temperature of the second heater HT2 is decreased from temperature T3 to temperature T5. A temperature transition period is indicated as ΔP6. The state of each valve is as follows.

(Sixth Period P6): Growth Stop Period
First gas supply valve V1: CLOSE
Second gas supply valve V2: OPEN
Gas exhaust valve V3: OPEN In addition, during the period from the fourth period P4 to the sixth period P6, the first heater HT1 is set to the temperature T4 (=T1, T2), and the precursor gas is suppressed from adhering to the periphery of the gas supply port.

Next, a method of increasing the thickness of a film will be described.

Figure 4:
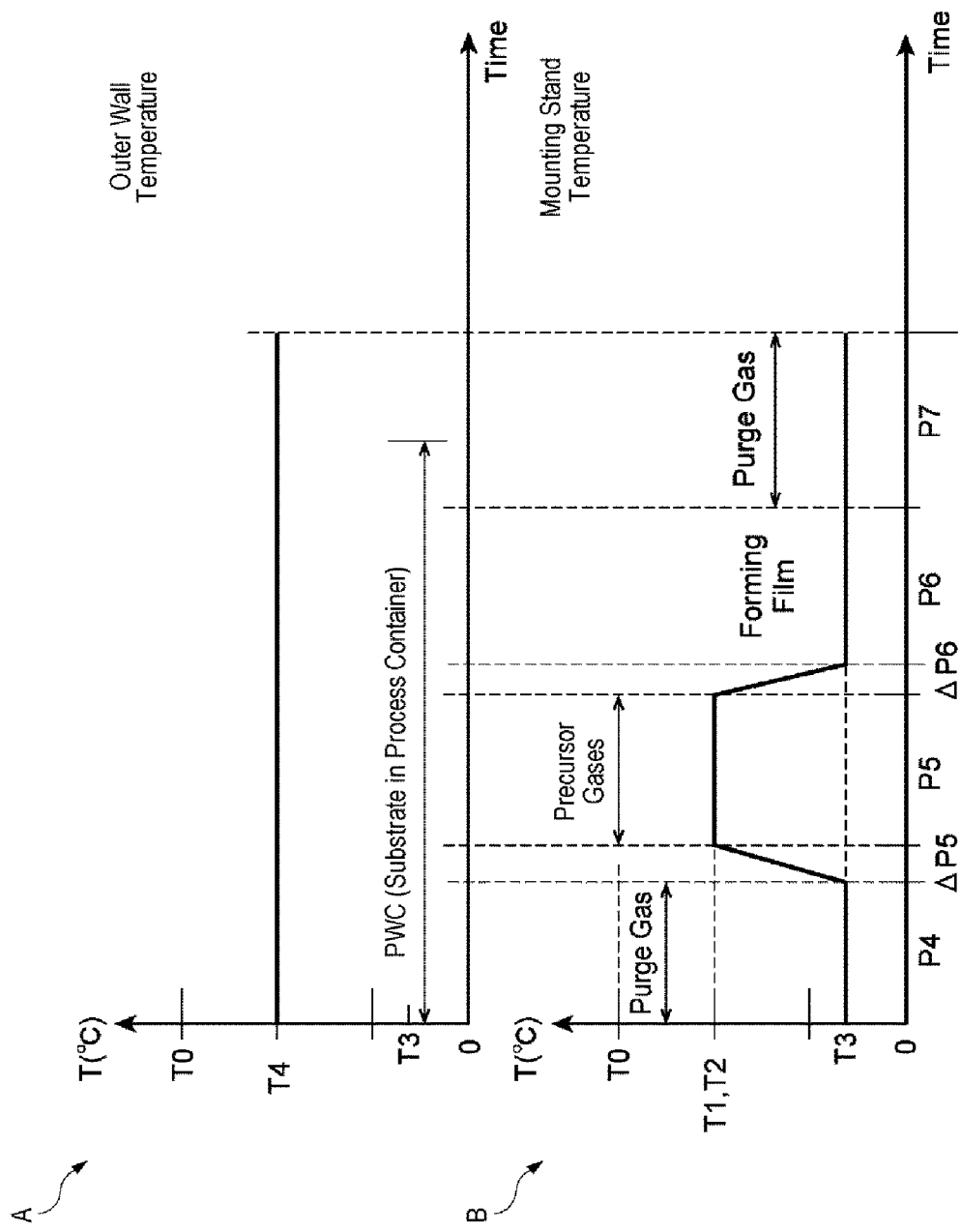
FIG. 4 illustrates timing charts of a processing state.

FIG. 4 illustrates timing charts of a processing state.

Referring to FIG. 4, steps after the fourth period P4 in the steps illustrated in FIG. 2 are illustrated, but the substrate on which the initial film-forming processing has been completed is not unloaded to the outside of the process container 10. In this state, the temperature of the second heater HT2 is increased from the temperature T3 to the temperature T1 (or T2). A temperature transition period is indicated as ΔP5. The temperature T1 (or T2) is a temperature at which no film is formed on the substrate W. The fifth period P5 in this case is the same as the second period P2 illustrated in FIG. 2. That is, although the precursor gas is supplied into the process container 10, the film is not formed because the substrate temperature is high. Subsequently, the temperature of the second heater HT2 is decreased from the temperature T1 to the temperature T3. A temperature transition period is indicated as ΔP6. The sixth period P6 in this case is the same as the third period P3 illustrated in FIG. 2, and the thickness of the film increases. A seventh period P7 follows the sixth period P6. The seventh period P7 in this case is the same as the fourth period P4 (growth stop period) illustrated in FIG. 2.

In the third period P3 or the sixth period P6 (film-forming period), it is expected that the partial pressure of a precursor gas decreases and the growth rate decreases with the lapse of time. In the case of suppressing the lowering of the growth rate, a method such as lowering the substrate temperature during film-formation may be considered. Depending on the kind of the precursor gas, it is also assumed that the substrate temperature during the film-formation is raised from the temperature T3.

As described above, the film-forming method described above is a film-forming method for forming a film on the substrate W, in which assuming that the first period P1, the second period P2, and the third period P3 are set in this order and the thermal dissociation temperature of the film is a temperature T0. In the first period P1, the substrate W is set to a temperature T1 (T1<T0) at which no film is formed on the substrate W without supplying a precursor gas into the process container 10 in the state in which the substrate W is placed on the mounting stand 20 in the process container 10. In the second period (P2), the substrate W is set to a temperature T2 (T2<T0) (in the foregoing, T1=T2) at which no film is formed on the substrate W and the precursor gas is supplied into the process container 10 from the precursor gas supply pipe CS in the state in which the substrate W is placed on the mounting stand. In the third period P3, the substrate W is set to the film-forming temperature T3 (T3<T2) of a film to be formed on the substrate W in the state in which the substrate W is disposed on the mounting stand 20. Further, in the first period P1 to the third period P3, the process container 10 is set to a temperature T4 (T3<T4<T0, T1=T2=T4) at which no film is formed on the periphery of the gas supply port of the precursor gas supply pipe CS installed in the process container 10. In addition, when the thermal dissociation temperature of the film is the temperature T0, T1<T0, T2<T0, and T4<T0 (degrees C.) are also satisfied.

According to this film-forming method, in the state in which no film is formed on the periphery of the gas supply port of the process container 10 (the temperature T4) and in the state in which no film adheres to the substrate on the mounting stand 20 (the temperature T2), a precursor gas is filled in the process container (the second period P2). After the gas is filled, it is also possible to create a state (third period P3) of suppressing the generation of a gas flow in the process container 10 by controlling a valve connected to the process container 10. In the gas flow suppression state, if the temperature of the mounting stand 20 is lowered (the temperature T3), the precursor gas is bonded to form a film on the substrate W. In the third period P3, since the inside of the process container 10 is statically stable, it is possible to form a high-quality film.

Although the gas flow suppression state depends on the kind of the precursor gas, in this example, the gas flow suppression state means the case in which the amount of the precursor gas supplied into the process container is 100 sccm (100 cc at 0 degrees C. per minute) or less. In consideration of adiabatic expansion or attachment by spray impact in the case in which the precursor gas is supplied into the process container, even in the state in which a gas flow is generated, the amount of the precursor gas supplied can be 1 (slm) (1 liter per minute at 0 degrees C.) or less in order to form a high-quality and uniform film. Since the above-mentioned supplying amounts relate to the flow rates, it may be considered to include a carrier gas such as $N_2$. The capacity of the process container is, for example, 1 liter to 50 liters. In the case in which the precursor gas travels from the upper portion of the process container to the substrate, a cylindrical air flow of 10 cm in diameter impinges on the substrate, and 1.67 cc per second (=100 sccm) is sprayed to the surface of the substrate, the flow speed of the gas flow having a thickness of 1 cm flowing along the surface of the substrate is 0.53 mm/sec in the direction toward the outside of the cylinder at the outer edge of the cylinder, and the flow speed of the gas flow having the thickness of 1 mm is 5.3 mm/sec. Therefore, although the gas flow suppression state depends on the kind of the precursor gas, in the above case, the flow speed of the gas flow is suppressed to 5.3 mm/sec or less at the maximum. In the gas flow suppression state, such a static state of the gas flow may be created, such that a high-quality and uniform film can be formed.

In addition, each period PP to P7 may be determined according to the purpose. Since each period P0, P3, or P5 depends on the thickness of the film to be formed, each period may be set, for example, within several tens of seconds to tens of minutes. For example, each of the periods PP, P1, P2, P4, P6, and P7 may be set to about several seconds to several minutes (5 minutes).

According to the film-forming apparatus and the film-forming method of the present disclosure, it is possible to produce a high-quality film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope of the disclosures.

What is claimed is:

1. A film-forming apparatus comprising:
a process container;
a mounting stand disposed in the process container;
a precursor gas supply pipe configured to communicate with the process container;
an exhaust pipe configured to communicate with the process container;
a first heater configured to heat the process container;
a second heater configured to heat the mounting stand; and
a controller connected to the first heater and the second heater, wherein the controller is configured to:
in a first period, set the second heater to a temperature T1 at which no film is formed on a substrate disposed on the mounting stand, without supplying a precursor gas into the process container, in a state in which the substrate is disposed on the mounting stand;
in a second period after the first period, set the second heater to a temperature T2 at which no film is formed on the substrate and supply the precursor gas into the process container from the precursor gas supply pipe in the state in which the substrate is disposed on the mounting stand;
in a third period after the second period, set the second heater to a film-forming temperature T3 which is lower than the temperature T2 in the state in which the substrate is disposed on the mounting stand; and
in the first period to the third period, set the first heater to a temperature T4, which is greater than the temperature T3, at which no film is formed on a periphery of a gas supply port of the precursor gas supply pipe by bonding the precursor gas that flows into the process container from the precursor gas supply pipe,
wherein the controller is further configured to control a flow rate of the precursor gas supplied into the process container in the third period to be lower than a flow rate of the precursor gas supplied into the process container in the second period.

2. The film-forming apparatus of claim 1, wherein the temperature T1 is lower than a thermal dissociation temperature T0 of the film,
wherein the temperature T2 is lower than the temperature T0, and
wherein the temperature T4 is lower than the temperature T0.

3. The film-forming apparatus of claim 1, further comprising:
a gas supply valve installed in the precursor gas supply pipe; and
a gas exhaust valve installed in the exhaust pipe,
wherein the controller is further configured to:
control the gas supply valve to be opened and the gas exhaust valve to be closed for at least one predetermined period in the second period.

4. The film-forming apparatus of claim 3, wherein the gas exhaust valve is closed during the third period.

5. The film-forming apparatus of claim 3, wherein the gas supply valve is closed during the third period.

6. The film-forming apparatus of claim 1, wherein a shower structure configured to control a flow of the precursor gas is not installed in a gas flow path between the mounting stand and the precursor gas supply pipe.

7. The film-forming apparatus of claim 1, wherein the controller is further configured to:
after the third period, stop a supply of the precursor gas from the precursor gas supply pipe and set the second heater to an annealing temperature T5, which is greater than the temperature T2, in the state in which the substrate is disposed on the mounting stand.

8. The film-forming apparatus of claim 1, wherein the controller is further configured to:
in the first period, control a purge gas control valve to supply a purge gas into the process container.

9. The film-forming apparatus of claim 1, wherein the controller is further configured to:
in a period before the first period, set the second heater to a thermal dissociation temperature T0 of a film in a state in which an upper surface of the mounting stand is exposed.

10. A film-forming method of forming a film on a substrate, the method comprising:
setting, in a first period, the substrate disposed on a mounting stand to a temperature T1 at which no film is formed on the substrate, without supplying a precursor gas into a process container, in a state in which the substrate is disposed on the mounting stand within the process container;

setting, in a second period after the first period, the substrate to a temperature T2 at which no film is formed on the substrate and supplying the precursor gas into the process container from a precursor gas supply pipe in the state in which the substrate is disposed on the mounting stand;

setting, in a third period after the second period, the substrate to a film-forming temperature T3, which is lower than the temperature T2, for the film to be formed on the substrate in the state in which the substrate is disposed on the mounting stand; and setting, in the first period to the third period, the process container to a temperature T4, which is greater than the temperature T3, at which no film is formed on a periphery of a gas supply port of the precursor gas supply pipe installed in the process container, wherein a flow rate of the precursor gas supplied into the process container in the third period is lower than a flow rate of the precursor gas supplied into the process container in the second period.

11. The film-forming method of claim 10, wherein the temperature T1 is lower than a thermal dissociation temperature T0 of the film, wherein the temperature T2 is lower than the temperature T0, and wherein the temperature T4 is lower than the temperature T0.

* * * * *